United States Patent [19]

Santin et al.

[11] Patent Number: 5,157,281

[45] Date of Patent: Oct. 20, 1992

[54] LEVEL-SHIFTER CIRCUIT FOR INTEGRATED CIRCUITS

[75] Inventors: Giovanni Santin; Sebastiano D'Arrigo, both of Houston; Michael C. Smayling, Missour City, all of Tex.

[73] Assignee: Texas Instruments Incorporated, Dallas, Tex.

[21] Appl. No.: 728,928

[22] Filed: Jul. 12, 1991

[51] Int. Cl.$^5$ ............................................. H01L 29/72
[52] U.S. Cl. ................................. 307/296.8; 307/303; 307/303.2; 307/475; 357/42
[58] Field of Search ............... 357/42; 307/303, 303.2, 307/264, 475, 296.8

[56] References Cited

U.S. PATENT DOCUMENTS

| 4,812,891 | 3/1989 | Bingham | 307/303.2 |
| 4,907,058 | 3/1990 | Sakai | 357/42 |
| 5,060,044 | 10/1991 | Tamassetti | 357/42 |
| 5,061,981 | 10/1991 | Hall | 357/42 |
| 5,066,995 | 11/1991 | Yang et al. | 357/42 |

Primary Examiner—Stanley D. Miller
Assistant Examiner—Scott A. Ouellette
Attorney, Agent, or Firm—Theodore D. Lindgren; Lawrence J. Bassuk; Richard L. Donaldson

[57] ABSTRACT

A level-shifter circuit includes a deep N-tank to insulate the N-channel portions of transistors from the substrate. The circuit is formed on a P-type substrate coupled to reference voltage Vss. A first field-effect transistor has first and second N+ doped regions formed in a third isolating P− doped region. The third doped region is formed in a fourth isolating N− doped region, which is formed in the substrate. A second transistor has first and second N+ doped regions formed in the same isolation regions as those of the first transistor. A third field-effect transistor has first and second P+ doped regions formed in an isolating N− region that is formed in the substrate. A fourth field-effect transistor has first and second N+ doped regions formed in the same isolation N− region as that of the third transistor. The gate of the first transistor is coupled to a first input. The first doped region of the first transistor is coupled to the output and the second doped region of the first transistor is coupled to the negative voltage Vn. The third doped region is coupled to the negative voltage Vn and the fourth doped region is coupled to the supply voltage Vdd. The second transistor is connected in feedback configuration to the first transistor. The gate of the third transistor is coupled to the second input. The first doped region of the third transistor is coupled to the output and the second doped region of the third transistor is coupled to the voltage Vp, which is more positive than the supply voltage Vdd. The fifth doped region of the third transistor is also coupled to the voltage Vp. The fourth transistor is connected in feedback configuration to the third transistor.

15 Claims, 2 Drawing Sheets

LEVEL-SHIFTER CIRCUIT FOR INTEGRATED CIRCUITS

BACKGROUND OF THE INVENTION

This invention relates to semiconductor memory devices and, more particularly, to field-effect transistor circuitry for using the supply and the reference voltages to switch a voltage higher than the supply voltage and to switch a negative voltage. Circuitry for shifting such positive and negative voltages is used, for example, in the row-line driver circuits of nonvolatile memory arrays, such as electrically-erasable, electrically-programmable, read-only-memory (EEPROM) arrays.

An EEPROM memory cell typically comprises a floating-gate field-effect transistor. The floating-gate of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate of a non-programmed cell is neutrally charged (or slightly positively or negatively charged) such that the source-drain path under the non-programmed floating gate is conductive when the predetermined voltage is applied to the control gate. The conductive state is read by a sense amplifier as a "one" bit.

Each column and row of an EEPROM array may contain thousands of floating-gate memory cells. The sources of each cell in a column are connected to a source-column line and the source-column line for a selected cell may be connected to reference potential or ground during reading of the selected cell by a sense amplifier. The drains of each cell in a column are connected to a separate bitline (drain-column line). The control gates of each cell in a row are connected to a row line. The row line for a selected cell is connected by a row-line driver circuit to a voltage more positive than the supply voltage during programming of that cell. The row line for a selected cell is connected to a negative voltage during erasing of that cell.

Field-effect transistor technology allows the generation of a negative voltage with respect to the circuit ground by using a voltage-multiplying technique. In the conventional field-effect transistor processes, charge-pump circuits use only P-channel-type devices due to the necessity for insulating the generated negative voltage from the substrate, which is generally tied to the circuit ground. Also, no N-channel-type transistors can be used in the negative voltage path since the N+/P− junction between the transistor source or drain and the substrate would be forward-biased for direct conduction, thus shorting the negative voltage to reference voltage Vss.

This fact has limited negative-voltage charge-pump applications to those applications in which bulk-type negative biasing is used.

Previously, circuits, such as memory row-decoders, have been developed to switch a negative voltage. However, the implementation of those circuits has been difficult for a number of reasons. One of those reasons is a requirement for P-channel-type depletion transistors. In other such circuits, a separate negative charge pump must be implemented for each node of the circuit, requiring an independent selection means for each charge pump. And in other such circuits, use of silicon-on-insulator technology is required. Where such circuits use P-channel-type only circuitry, a more negative voltage is required to control the switching.

Recent advances in semiconductor processes have resulted in the availability of a deep N- tank process for implementing high-power field-effect transistors.

There is a need for a field-effect-transistor inverter-level-shifter that functions to select and to switch a voltage Vp higher than supply voltage Vdd and a voltage Vn lower than reference voltage Vss.

SUMMARY OF THE INVENTION

The field-effect transistor level-shifter of this invention selects and deselects a voltage Vp higher than supply voltage Vdd and a voltage Vn lower than reference voltage Vss using a deep N-tank to insulate the N-channel portions from the substrate.

The circuit is formed on a substrate of first-conductivity-type coupled to reference voltage Vss. A first field-effect transistor has first and second N+doped regions formed in a third isolating P− doped region. The third doped region is formed in a fourth isolating N− doped region, which is formed in the substrate. A second transistor has first and second N+doped regions that may be formed in the same isolation regions as those of the first transistor. A third field-effect transistor has first and second P+doped regions formed in an isolating N− region that is formed in the substrate. A fourth field-effect transistor has first and second N+doped regions that may be formed in the same N− region as that of the third transistor.

The gate of the first transistor is coupled to a first input. The first doped region of the first transistor is coupled to the output and the second doped region of the first transistor is coupled to the negative voltage Vn. The third doped region is coupled to the negative voltage Vn and the fourth doped region is coupled to the supply voltage Vdd. The gate of the second transistor is coupled to the output. The first doped region of the second transistor is coupled to the first input and the second doped region of the second transistor is coupled to the negative voltage Vn. The gate of the third transistor is coupled to the second input, which may be the same as the first input. The first doped region of the third transistor is coupled to the output and the second doped region of the third transistor is coupled to the voltage Vp, which is more positive than the supply voltage Vdd. The fifth doped region of the third transistor is also coupled to the voltage Vp. The gate of the fourth transistor is coupled to the output. The first doped region of the fourth transistor is coupled to the second input and the second doped region of the fourth transistor is coupled to the voltage Vp.

DETAILED DESCRIPTION OF A SPECIFIC EMBODIMENT

Figure 1:
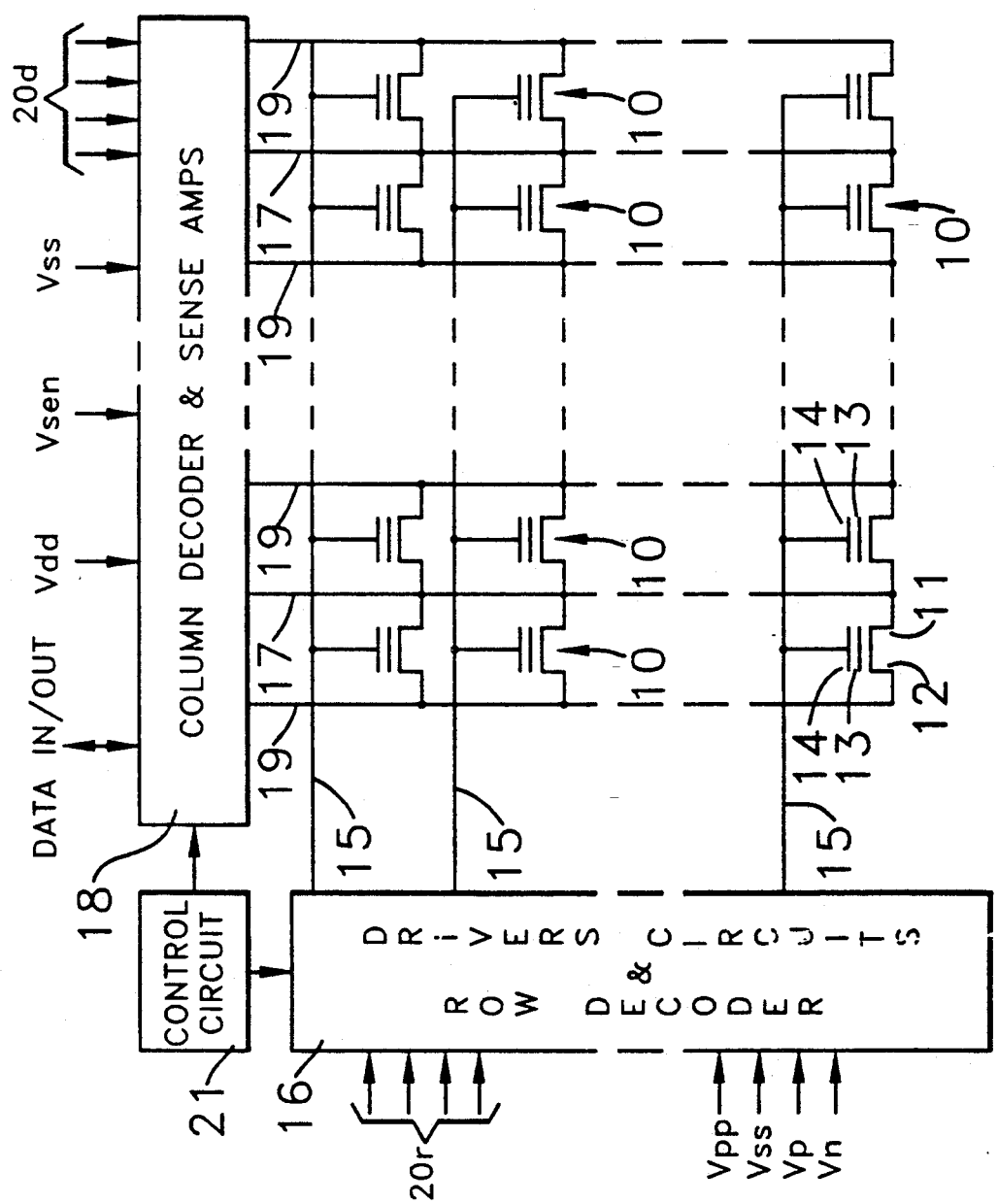
FIG. 1 is a representation of an array of nonvolatile memory cells and associated circuitry.

Referring to FIG. 1, an example array of EEPROM memory cells, which is an integral part of a memory chip, is shown for the purpose of illustrating this invention. Each EEPROM cell is a floating-gate transistor 10 having a source 11, a drain 12, a floating gate 13 and a control gate 14. Each of the control gates 14 in a row of cells 10 is connected to a row line 15, and each of the row lines 15 is connected to a row decoder 16, which includes row driver circuits. Each of the sources 11 in a column of cells 10 is connected to a source-column line 17, and each of the source-column lines 17 is connected to a column decoder 18, which includes at least one sense amplifier circuit. Each of the drains 12 in a column of cells 10 is connected to a drain-column line (bitline) 19, and each of the bitlines 19 is connected to the column decoder 18.

In a write or program mode, the row decoder 16 may function, in response to row-line address signals on lines 20r and to a signal from control circuit 21, to place a preselected first programming voltage Vp (approx. +16 to +18 volts) on a selected row line 15, including a selected control-gate 14. Control circuit 21 may include a microprocessor separate from the memory chip. Column decoder 18, in response to signals on lines 20d and to a signal from control circuit 21, may function to place a preselected second programming voltage (reference potential Vss or ground, or a non-positive voltage) on selected source-column line 17, which includes a selected source region 11. The preselected second programming voltage Vss must differ sufficiently from the first preselected programming voltage Vp that excess electrons will migrate, perhaps by Fowler-Nordheim tunneling, to the selected floating-gate 13 and, as a result, program that selected floating-gate 13. Column decoder 18 and row decoder 16 may optionally, in response to signals on lines 20d and 20r and in response to a signal from control circuit 21, place voltages of about +7 volts on deselected source-column lines 17 and/or on deselected row lines 15 to prevent a disturb of the programmed status of deselected cells 10. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

During erase mode of operation, the column decoder 18 may, for example, function to apply a positive voltage Vdd (approx. +5 volts) to the selected source-column line 17. The column decoder 18 may also, for example, function to leave at least the selected drain-column line 19 floating. The row decoder 16 may, for example, function to apply a high negative voltage Viii (approx. −11 volts) to the selected row line 15. The applied voltages function to remove excess electrons from the floating gate 13 of the a selected programmed cell 10.

In the read mode, the row decoder 16 functions, in response to row-line address signals on lines 20r and to a signal from control circuit 21, to apply a preselected positive voltage (approx. +3 to +5 volts) to the selected row line 15 (and the selected control gate 14), and to apply a low voltage (ground or Vss) to deselected row lines 15. The column decoder 18 functions, in response to column address signals on lines 20d, to apply a preselected positive voltage Vsen (approx. +1 to +1.5 volts) to the selected drain-column line 19. The column decoder 18 also functions to connect all source-column lines 17 to ground (or Vss). The conductive or nonconductive state of the cell 10 connected to the selected drain-column line 19 and the selected row line 15 is detected by a sense amplifier, which supplies data to the DATA IN/OUT terminal.

As is well-known, the source 11 regions and the drain 12 regions of the memory cells 10 may be interchanged for the various modes of operation. For example, Fowler-Nordheim tunneling for programming and/or erasing may take place between a drain 12 region and a floating-gate 13, or between a source 11 region and a floating-gate 13. Voltages applied to the source 11 and drain 12 regions in the read example above are interchangeable. Therefore, the terms "source" and "drain" as used herein are considered interchangeable for each mode of operation.

For convenience, a table of read, write and erase voltages is given in the TABLE I below:

TABLE I

|  | Read | Write | Erase |
| --- | --- | --- | --- |
| Selected Row Line | 3-5 V | 16-18 V | −11 V |
| Deselected Row Lines | 0 V | 7 V |  |
| Selected Source Line | 0 V | 0 V | 5 V |
| Deselected Source Lines | Float | 7 V |  |
| Drain Lines | 1-1.5 V | Float | Float |

Figure 2:
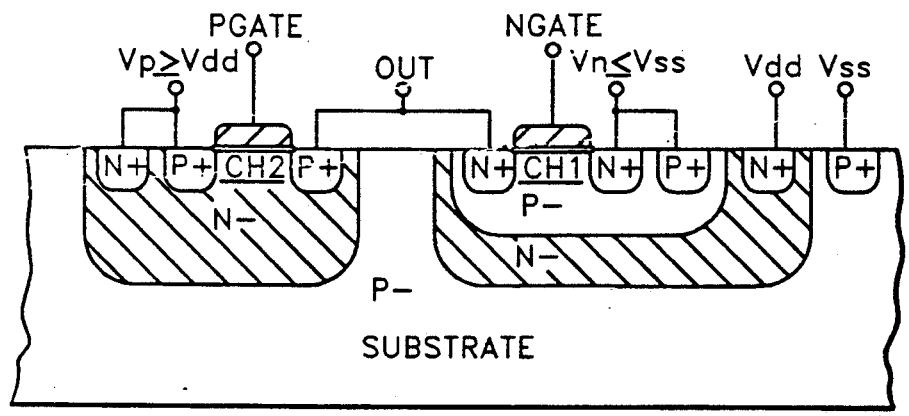
FIG. 2 is a cross-section of a semiconductor substrate showing diffused regions forming the transistors used in the circuit of this invention.

FIG. 2 illustrates a deep N− tank configuration enclosing a P− tank in which an N-channel-type transistor is formed. The N-channel-type transistor is insulated from the substrate by the deep N− tank connected to a supply voltage Vdd and, therefore, the applied voltage Vn can be lower than reference voltage Vss, thus making possible the selection of a negative voltage Vn. The P-channel-type transistor is insulated from the substrate by a relatively shallow N− tank. That N− tank allows a voltage Vp to be applied to a source-drain region of the P-channel-type transistor where that voltage Vp is greater in magnitude than the supply voltage Vdd.

If the signals driving PGATE terminal and the NGATE terminal are at the normal field-effect-transistor levels (voltage levels between Vss and Vdd, some form of feedback is needed to render the P-channel-type or the N-channel-type device nonconductive. An embodiment of a circuit that furnishes a form of feedback is illustrated in FIG. 3.

Figure 3:
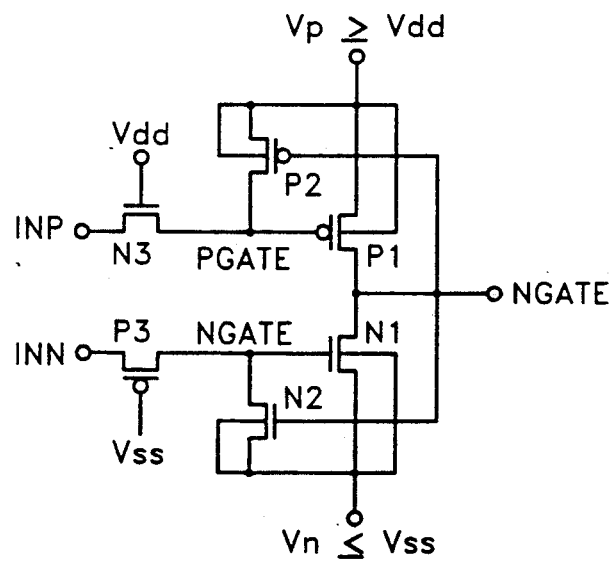
FIG. 3 is a schematic representation of an embodiment of the switching circuit of this invention.

Referring to FIG. 3, the level-shifter circuit illustrated has a supply voltage Vdd, a reference voltage Vss, a negative voltage Vn, a voltage Vp more positive than the supply voltage Vdd, a first input INN, a second input INP (which may be the same as the first input INN) and an output OUT. The circuit is formed on a substrate of first-conductivity-type coupled to reference voltage Vss.

A first field-effect transistor N1 has first and second doped regions N+ of a second conductivity-type formed in a third doped region P− of first conductivity-type. The third doped region P− of the first transistor N1 is formed in a fourth doped region N− of second conductivity-type and the fourth doped region N− of the first transistor is formed in the SUBSTRATE as illustrated in FIG. 2.

A second field-effect transistor N2 also has first and second doped regions of the second conductivity-type and the first and second doped regions are also formed in a third doped region of first conductivity-type. The third doped region of the second transistor is also formed in the fourth doped region of second conductivity-type.

A third field-effect transistor P1 has first and second doped regions P+ of first conductivity-type formed in a fifth doped region N− of second conductivity-type. The fifth doped region N− is formed in the SUBSTRATE as illustrated in FIG. 2.

A fourth field-effect transistor P2 also has first and second doped regions of first conductivity-type formed in a fifth doped region of second conductivity-type.

A fifth field-effect transistor of second conductivity-type has a gate and a source-drain path. The gate of the fifth transistor is coupled to the reference voltage and the source-drain path of the fifth transistor is coupled between the first input INN and the gate of the first field-effect transistor N1.

A sixth field-effect transistor of first conductivity-type has a gate and a source-drain path. The gate of the sixth transistor N3 is coupled to the supply voltage Vdd and the source-drain path of the sixth transistor N3 is coupled between the second input INP, and/or the first input INN, and the gate of the third field-effect transistor P1.

The first transistor has a channel region CHI between the first and second doped regions, has a gate NGATE insulated from the channel region. The gate NGATE of the first transistor is coupled to the first input INN. The first doped region N+ of the first transistor is coupled to the output OUT and the second doped region N+ of the first transistor is coupled to the negative voltage Vn. The third doped region P− is coupled to the negative voltage Vn and the fourth doped region N− is coupled to the supply voltage Vdd.

The second transistor N2 has a channel region between first and second doped regions and has a gate insulated from the channel region. The gate of the second transistor N2 is coupled to the output OUT. The first doped region of the second transistor N2 is coupled to the first input INN and the second doped region of the second transistor N2 is coupled to the negative voltage Vn.

The third transistor P1 has a channel region CH2 between the first and second doped regions P+ and has a gate PGATE insulated from the channel region CH2. The gate of the third transistor P1 is coupled to the second input INP (and/or the first input INN). The first doped region P+ of the third transistor P1 is coupled to the output OUT and the second doped region P+ of the third transistor is coupled to the voltage Vp, which is more positive than the supply voltage Vdd. The fifth doped region N− of the third transistor is also coupled to the voltage Vp.

The fourth transistor P2 has a channel region between first and second doped regions and has a gate insulated from the channel region. The gate of the fourth transistor P2 is coupled to the output OUT. The first doped region of the fourth transistor P2 is coupled to the second input INP (which may be the same as the first input INN) and the second doped region of the fourth transistor P2 is coupled to the voltage Vp.

The first conductivity-type may be P-type and one of either the supply voltage Vdd or the reference voltage Vss may be coupled to the input terminals INP and INN.

When Vp = Vdd and Vn = Vss, the circuit of FIG. 3 operates as a field-effect-transistor inverter. When the INP and INN terminals are at Vdd, transistor P1 is nonconductive, transistor N1 is conductive and, therefore, the output terminal OUT is at Vss. The feedback transistor P2 restores the full Vdd level on the PGATE terminal.

When the INP and INN terminals are at Vss, transistor P1 is conductive and transistor N1 is nonconductive and, therefore, the output terminal OUT is at supply voltage Vdd. The feedback transistor N2 restores the full reference voltage Vss level on the NGATE terminal to ensure that transistor N1 is nonconductive.

If a voltage Vp higher than supply voltage Vdd is selected for output terminal OUT, the reference voltage Vss level is applied to terminals INP and INN and, therefore, terminal OUT will go to the supply voltage Vdd level as explained before. When the switching is completed, the voltage Vp may be raised higher than Vdd and the voltage at the output terminal OUT will follow the applied voltage Vp.

If a voltage Vn lower than reference voltage Vss is selected for output terminal OUT, the supply voltage Vdd level is applied to terminals INP and INN. When the switching is completed and the output terminal OUT is at reference voltage Vss, the negative voltage Vn may be lowered from Vss and the voltage at the output terminal OUT will follow the applied voltage negative voltage Vn.

Figure 4:
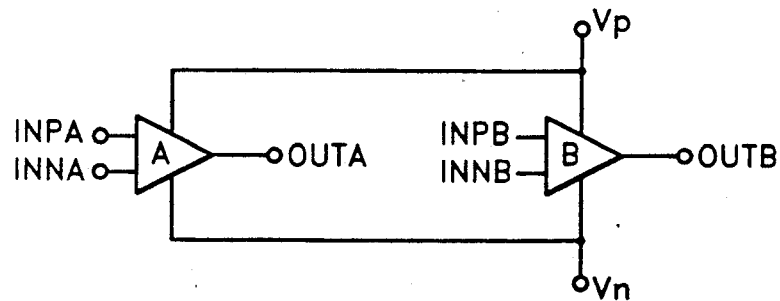
FIG. 4 is a block diagram illustrating use of the circuit of FIG. 3 for selecting and deselecting voltages higher than the supply voltage of lower than the reference voltage.

If a voltage Vp higher than supply voltage Vdd and a voltage Vn lower than reference voltage Vss are both selected and both deselected, the circuit of FIG. 4 is used. Each of the circuits A and B of FIG. 4 may be identical to the circuit of FIG. 3.

If a voltage higher than Vdd is selected for output terminal OUTA and deselected for output terminal OUTB, then terminals INPA and INNA are tied to Vss. Circuit A operates as explained in the previous section in which the operation of the circuit of FIG. 3 was discussed. Circuit B operates with terminals INPB and INNB tied to Vdd and, referring to FIG. 3, the circuit B operates with Vn = Vss. Transistor N1 is conductive and, therefore, terminal OUTB is at voltage level Vss. Feedback transistor P2 is conductive and raises the voltage at PGATE to Vp, thus causing transistor P1 to be nonconductive and, therefore, the charge pump circuit driving the Vp terminal will not be loaded by direct current. Transistor N3 is nonconductive and, therefore, the voltage source Vp is insulated from the circuit driving INPB and INNB.

If a voltage lower than Vss is selected for output terminal OUTA and deselected for output terminal OUTB, then terminals INPA and INNA are tied to Vdd and the circuit A operates as explained in the previous section discussing operation of the circuit of FIG. 3. Circuit B operates with terminals INPB and INNB tied to Vss and, referring again to FIG. 3, the circuit B operates with Vp = Vdd. Transistor P1 is conductive and, therefore, terminal OUTB is at supply voltage Vdd. Feedback transistor N2 is conductive and, therefore, terminal NGATE is lowered to Vn. Therefore, transistor N1 is nonconductive and the charge pump driving Vn is not loaded by direct current. Transistor P3 is nonconductive and, therefore, voltage Vn is insulated from the circuit driving terminals INP and INNB.

In conclusion, the field-effect-transistor circuit of this invention may be formed on a substrate that is biased to Vss, yet the circuit is able to select and deselect voltages higher than circuit supply voltage Vdd and lower than reference voltage Vss.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A level-shifter circuit having a supply voltage, a reference voltage, a negative voltage, a first input and an output, said circuit formed on a substrate of first-conductivity-type coupled to said reference voltage, said circuit comprising:

a first field-effect transistor having first and second doped regions of a second conductivity-type, said first and second doped regions of said first transistor in a third doped region of said first conductivity-type, said third doped region of said first transistor in a fourth doped region of said second conductivity-type, said fourth doped region of said first transistor in said substrate;

said first transistor having a channel region between said first and second doped regions, having a gate insulated from said channel region, said gate of said first transistor coupled to said first input, said first doped region of said first transistor coupled to said output, said second doped region of said first transistor coupled to said negative voltage, said third doped region coupled to said negative voltage, and said fourth doped region coupled to said supply voltage.

2. The level-shifter circuit of claim 1, including:

a second field-effect transistor having first and second doped regions of said second conductivity-type, said first and second doped regions of said second transistor in said third doped region of said first conductivity-type, said third doped region of said second transistor in said fourth doped region of said second conductivity-type;

said second transistor having a channel region between said first and second doped regions, having a gate insulated from said channel region of said second transistor, said gate of said second transistor coupled to said output, said first doped region of said second transistor coupled to said first input, said second doped region of said second transistor coupled to said negative voltage.

3. The level-shifter circuit of claim 1, including:

a second input and a voltage more positive than said supply voltage;

a second field-effect transistor having first and second doped regions of said first conductivity-type, said first and second doped regions of said second transistor in a fifth doped region of said second conductivity-type, said fifth doped region of said second transistor in said substrate;

said second transistor having a channel region between said first and second doped regions, having a gate insulated from said channel region of said second transistor, said gate of said second transistor coupled to said second input, said first doped region of said second transistor coupled to said output, said second doped region of said second transistor coupled to said voltage more positive than said supply voltage, said fifth doped region of said second transistor coupled to said voltage more positive than said supply voltage.

4. The level-shifter circuit of claim 1, including:

a second input and a voltage more positive than said supply voltage;

a second field-effect transistor having first and second doped regions of said first conductivity-type, said first and second doped regions of said second transistor in a fifth doped region of said second conductivity-type, said fifth doped region of said second transistor in said substrate;

said second transistor having a channel region between said first and second doped regions, having a gate insulated from said channel region of said second transistor, said gate of said second transistor coupled to said output, said first doped region of said second transistor coupled to said second input, said second doped region of said second transistor coupled to said voltage more positive than said supply voltage, said fifth doped region of said second transistor coupled to said voltage more positive than said supply voltage.

5. The level-shifter circuit of claim 1, wherein said first conductivity-type is P-type.

6. The level-shifter circuit of claim 1, including a second field-effect transistor of a first conductivity-type having a gate and a source-drain path, wherein said gate of said second transistor is coupled to said reference voltage and said source-drain path of said second transistor is coupled between said first input and said gate of said first field-effect transistor.

7. The level-shifter circuit of claim 1, wherein one of said supply voltage and said reference voltage is coupled to said first input.

8. A level-shifter circuit having a supply voltage, a reference voltage, a negative voltage, a voltage more positive than said supply voltage, a first input, a second input and an output, said circuit formed on a substrate of first-conductivity-type coupled to said reference voltage, said circuit comprising:

a first field-effect transistor having first and second doped regions of a second conductivity-type, said first and second doped regions of said first transistor in a third doped region of said first conductivity-type, said third doped region of said first transistor in a fourth doped region of said second conductivity-type, said fourth doped region of said first transistor in said substrate;

a second field-effect transistor having first and second doped regions of said second conductivity-type, said first and second doped regions of said second transistor in said third doped region of said first conductivity-type, said third doped region of said second transistor in said fourth doped region of said second conductivity-type;

a third field-effect transistor having first and second doped regions of said first conductivity-type, said first and second doped regions of said third transistor in a fifth doped region of said second conductivity-type, said fifth doped region of said third transistor in said substrate; and a fourth field-effect transistor having first and second doped regions of said first conductivity-type, said first and second doped regions of said fourth transistor in said fifth doped region of said second conductivity-type;

said first transistor having a channel region between said first and second doped regions, having a gate insulated from said channel region, said gate of said first transistor coupled to said first input, said first doped region of said first transistor coupled to said output, said second doped region of said first transistor coupled to said negative voltage, said third doped region coupled to said negative voltage, and said fourth doped region coupled to said supply voltage;

said second transistor having a channel region between said first and second doped regions, having a gate insulated from said channel region of said second transistor, said gate of said second transistor coupled to said output, said first doped region of said second transistor coupled to said first input, said second doped region of said second transistor coupled to said negative voltage;

said third transistor having a channel region between said first and second doped regions, having a gate insulated from said channel region of said third transistor, said gate of said third transistor coupled to said second input, said first doped region of said third transistor coupled to said output, said second doped region of said third transistor coupled to said voltage more positive than said supply voltage, said fifth doped region of said third transistor coupled to said voltage more positive than said supply voltage; and said fourth transistor having a channel region between said first and second doped regions, having a gate insulated from said channel region of said fourth transistor, said gate of said fourth transistor coupled to said output, said first doped region of said fourth transistor coupled to said second input, said second doped region of said fourth transistor coupled to said voltage more positive than said supply voltage.

9. The circuit of claim 8, wherein said first and second inputs are coupled together.

10. The circuit of claim 8, wherein said negative voltage changes from said reference voltage to said negative voltage after a signal is applied to said first terminal.

11. The circuit of claim 8, wherein said voltage more positive than said supply voltage changes from said supply voltage to said more positive voltage after a signal is applied to said second terminal.

12. A switching circuit having a supply voltage, a reference voltage, a negative voltage, an input and an output, said circuit formed on a substrate of first-conductivity-type coupled to said reference voltage, said circuit comprising:

a first field-effect transistor having first and second doped regions of a second conductivity-type, said first and second doped regions of said first transistor in a third doped region of said first conductivity-type, said third doped region of said first transistor in a fourth doped region of said second conductivity-type, said fourth doped region of said first transistor in said substrate; and a second field-effect transistor having first and second doped regions of said second conductivity-type, said first and second doped regions of said second transistor in a said third doped region of said first conductivity-type, said third doped region of said second transistor in a said fourth doped region of said second conductivity-type;

said first transistor having a channel region between said first and second doped regions, having a gate insulated from said channel region, said gate of said first transistor coupled to said input, said first doped region of said first transistor coupled to said output, said second doped region of said first transistor coupled to said negative voltage, said third doped region coupled to said negative voltage, and said fourth doped region coupled to said supply voltage; and said second transistor having a channel region between said first and second doped regions, having a gate insulated from said channel region of said second transistor, said gate of said second transistor coupled to said output, said first doped region of said second transistor coupled to said input, said second doped region of said second transistor coupled to said negative voltage.

13. The switching circuit of claim 12, wherein said first conductivity-type is P-type 14. The switching circuit of claim 12, including a third field-effect transistor of a first conductivity-type having a gate and a source-drain path, wherein said gate of said third transistor is coupled to said reference voltage and said source-drain path of said third transistor is coupled between said input and said gate of said first field-effect transistor.

15. The switching circuit of claim 12, wherein one of said supply voltage and said reference voltage is coupled to said first input.

* * * * *